United States Patent
Moore et al.

(10) Patent No.: US 9,790,407 B2
(45) Date of Patent: Oct. 17, 2017

(54) AQUEOUS DETERGENT SOLUBLE COATING AND ADHESIVE AND METHODS OF TEMPORARY BONDING FOR MANUFACTURING

(71) Applicant: John Moore, Camarillo, CA (US)

(72) Inventors: John Cleaon Moore, Camirillo, CA (US); Jared Pettit, Camarillo, CA (US)

( * ) Notice: Subject to any disclaimer, the term of this patent is extended or adjusted under 35 U.S.C. 154(b) by 228 days.

(21) Appl. No.: 14/772,374

(22) PCT Filed: Mar. 6, 2014

(86) PCT No.: PCT/US2014/021212
§ 371 (c)(1),
(2) Date: Sep. 2, 2015

(87) PCT Pub. No.: WO2014/164206
PCT Pub. Date: Oct. 9, 2014

(65) Prior Publication Data
US 2016/0009958 A1     Jan. 14, 2016

Related U.S. Application Data

(60) Provisional application No. 61/775,486, filed on Mar. 9, 2013.

(51) Int. Cl.
*B32B 27/36*     (2006.01)
*C09J 11/06*     (2006.01)
(Continued)

(52) U.S. Cl.
CPC ............... *C09J 11/06* (2013.01); *C09D 5/008* (2013.01); *C09J 133/26* (2013.01); *C09J 183/04* (2013.01);
(Continued)

(58) Field of Classification Search
CPC ........ C09J 11/06; C09J 133/26; C09J 183/04; H01L 21/02118; C08K 7/02
See application file for complete search history.

(56) References Cited

U.S. PATENT DOCUMENTS

2007/0084397 A1* 4/2007 Hansen ................. C03C 17/004
117/13
2009/0017248 A1* 1/2009 Larson .................... B32B 38/18
428/41.5

* cited by examiner

*Primary Examiner* — Shane Fang (57) ABSTRACT

Compositions and methods are described for a temporary coating and adhesive with adjustable acidity for use in coating work units as a planarization coating over high topography and also for affixing thin units onto a carrier whereby such compositions provide sufficient properties to support a manufacturing process, and upon completion, the compositions are removed by an aqueous detergent that dissolves and releases the work unit within a rapid time frame without harm to its integrity. The temporary adhesive provides a tunable acidity based upon Lewis acid represented as its acid dissociative constant, $K_a$, where it is preferred to have $K_a \geq 1\times10^{-6}$ ($pK_a \leq 6$), more preferred $K_a \geq 1\times10^{-5}$ ($pK_a \leq 5$), and most preferred $K_a \geq 1\times10^{-4}$ ($pK_a \leq 4$). The temporary coating and adhesive may be applied and cured in a variety of ways that meet the needs of the work unit and objectives of the manufacturing process. The invention provides benefits of flexibility and reduced cost when establishing practices to handle difficult work units in the manufacture of semiconductors and flat panel displays.

22 Claims, 1 Drawing Sheet

(51) Int. Cl.
  *C09D 5/00* (2006.01)
  *C09J 133/26* (2006.01)
  *C09J 183/04* (2006.01)
  *H01L 21/02* (2006.01)
  *C08K 3/08* (2006.01)
  *C08K 3/40* (2006.01)
  *C08K 7/02* (2006.01)
  *C08K 7/20* (2006.01)
(52) U.S. Cl.
  CPC .......... *H01L 21/02118* (2013.01); *C08K 3/08* (2013.01); *C08K 3/40* (2013.01); *C08K 7/02* (2013.01); *C08K 7/20* (2013.01)

AQUEOUS DETERGENT SOLUBLE COATING AND ADHESIVE AND METHODS OF TEMPORARY BONDING FOR MANUFACTURING

CROSS-REFERENCE TO RELATED APPLICATION

This application claims the benefit of U.S. Provisional Application No. 61/775,486, filed Mar. 9, 2013.

FIELD OF THE INVENTION

The present invention relates generally to producing coatings and adhesives used in applications of temporary support of inorganic substrates during thinning and further processing in electronics manufacturing. In particular, the present invention relates to compositions which produce coatings and adhesives used to encapsulate and affix a work product to a carrier substrate, and upon completion of subsequent processing, allow its chemical breakdown, release, and cleaning to be conducted with an aqueous detergent. Methods which use detergent soluble coatings and adhesives represent a dramatic deviation from the use of toxic and flammable organic solvents and allow consideration for batch-style cleaning processes to be used in the manufacture of semiconductor wafers and flat panel displays.

BACKGROUND OF THE INVENTION

As demand for electronic device miniaturization and increased power continues, there is a corresponding need dissipate heat during the component's operation by reducing the components size, thickness, in order to improve its user-friendly nature to consumers. Thinned substrates reduce weight, dissipate heat, and aid in device electrical operation. In semiconductors, where connections between stacked chips are shortened and made with through silicon vias (TSVs), the result increases impedance in the device performance. In flat panel displays, thin substrates reduce weight and increase flexibility to aid in a wide range of ergonomic shapes and sizes.

While the benefits of thinned substrates are recognized, it is generally understood that handling delicate substrates is technologically challenging. As testimony of this fact, there exist no less than five (5) commercial temporary adhesive technologies for handling thin substrates, all of which require robotic process tools and downgrades in throughput. The commercialized technologies are similar, in that they all use spin coating to apply the adhesive, they all achieve a minimum thermal resistance of 200° C., and their demount and cleans require processing with a single substrate handling tool (i.e. robot aided demount operation). With one exception where the use is an amorphous rubber, all of the adhesives are cross-linked, as in the case of silicone, polyimide, and acrylic. Demounting cross-linked materials requires destroying the bond at the interface. These practices vary between variable applied forces in different ergonomic directions with and without thermal assistance, or the use of laser assisted ablative methods to destroy the adhesive interface. These methods are complex, impose undue stresses on the work unit, and result in adhesive residue that is difficult or impossible to remove without permanent damage to the wafer. Costs of single wafer handling tools are expensive and exhibit low throughput with yield losses from the inability to control the aforementioned materials conditions and irregularities in the process.

Display operations are fast catching-up to semiconductor wafer's demand for thin substrates. Glass substrates produce undue hardship on manufacturing, packaging, shipping, and from the consumer's standpoint, becomes a challenge to handle such an item as it is burdened by weight and cost. New designs for displays include thin glass substrates for thin film transistor (TFT) and flexible organic substrates for organic light emitting diode (OLED) devices. Engineers at the fabs are struggling with new ways of processing thin work units of varying shapes, sizes, and thicknesses. Tooling is standardized and costly to change. Next generation ideas surround approaches of temporarily mounting work units onto glass carrier substrates of standard thickness and size to facilitate manufacturing without a high investment into new tooling. With the advent of new environmental regulations in Europe, pressure from the consumer on the use of green manufacturing practices is moving upstream to the fabs in Asia.

From the foregoing described regimen, a need exists for an adhesive that is simple to use and green. Green systems eliminate toxic solvents and waste. A detergent soluble system may provide flexible alternatives to fab engineers to use their existing tooling and designs without costly changes. An adhesive is needed in semiconductor manufacturing to achieve a planarized coating over topography, mounts to rigid substrates, is resistant to the thermal and chemical rigors of the of the manufacturing process, and can be removed and cleaned using chemistries that are EHS friendly. Further, display processes need temporary adhesives to affix irregular shaped, sized, and thick work units onto carrier substrates. It is especially important for display operations to proceed simply and without the burdens of cost. This invention provides an adhesive system that is soluble in detergent and when used at selected process parameters and conditions, affords a mechanism that provides substantial benefit for manufacturing.

Primary purposes for the use of thin substrates in manufacturing microelectronic devices, includes their enhanced cooling of the device during operation, enabling of substrate stacking, for example, as in three dimensional (3-D) packaging, and to reduce the mass of the final product. Conventional methods to achieve thinning are driven to smaller thicknesses but are limited by the fragile nature of the device substrate. When pursuing very thin objectives, a support structure is used (i.e. carriers), whereby a tool handles the support structure and thinning of the microelectronic substrate is achieved without damage.

Examples of final products in microelectronics where there exists a desire to thin substrates includes integrated circuits (IC), microelectromechanical systems (MEMS), and large irregular panel dimensions as in flat panel displays (FPD) and solar substrates. Manufacturing ICs and MEMS are typically conducted upon wafers of standard diameters that are composed of silicon or compound semiconductor species and are taken to ultra-thin values and subsequently stacked to achieve designs in 3-D packaging. Where FPDs and solar panels are concerned, thinned substrates of various shapes are required to reduce weight to meet ergonomic objectives of the final customer package. Conventional technologies for achieving thin device substrates include mechanical grinding and chemical etching, and where ultra-thin dimensions are in demand, various protecting and handling materials are used as tapes, coatings, and externally mounted rigid supports (i.e. carriers). Both semiconductor and display fabs use carrier supports handling work units at <100 microns (<100 µm), sustaining added processes, including resist pattering, plasma etching, post-etch residue cleans, and metallization.

Not only does wafer thinning help to dissipate heat, but it also aids in the electrical operation of the IC. Substrate thickness affects impedance and capacitance performance of certain connecting leads, e.g. transmission lines, of given thickness from the top of the IC to the bottom where contact is made to the PWB. Thick substrates cause an increase in capacitance, requiring thicker transmission lines, and in turn, a larger IC footprint. Substrate thinning increases impedance while capacitance decreases, causing a reduction in transmission line thickness, and in turn, a reduction in IC size. In other words, substrate thinning facilitates IC both performance and miniaturization.

An additional incentive in support of substrate thinning involves geometrical reasons. Via-holes are etched into the backside of an IC device wafer to facilitate front side contacts. In order to construct a via-hole (hereafter sometimes referred to as a "Via" or "Vias") using common dry-etch techniques, minimum geometrical design standards apply. Namely, for IC substrates of the gallium arsenide (GaAs) type with thicknesses of <100 um, a 30-70 um diameter via may be constructed using dry-etch methods that produce minimal post-etch residue within an acceptable time. In silicon substrates of thicknesses of <25 um, vias of much smaller diameter of <10 um, sometimes referred to as through silicon vias (TSVs), are used for communication between stacked chips in 3-D packaging. Due to the complexity of silicon ICs, many TSVs are required for connectivity. As substrates are thinned further to smaller dimensions, smaller diameter vias may be used, requiring shorter etch times, producing smaller amounts of post-etch residue, and promoting greater throughput. Smaller vias require less metallization and in turn, lower cost. Therefore, from the standpoint of backside processing, thin substrates can always be processed quicker and at lower cost.

A final consideration in support of thin substrates is that they are more easily cut and scribed into devices. Thinner substrates have a smaller amount of material to penetrate and cut, and therefore require less effort. Whether the method used is sawing, scribe and break, or laser ablation, microelectronic devices are easier to cut from thinner substrates.

In the case where a microelectronic device is manufactured on a wafer, the substrates are thinned after wafer front side operations are complete. In this case, the devices are fabricated onto wafers that exist at their normal full-size thickness, e.g. 600-700 um (0.024-0.028"). Once completed, they are thinned to 100-150 um (0.004-0.006"). In some cases, as in hybrid substrates used for high power devices, e.g. Gallium Arsenide (GaAs), thickness may be taken down to 25 um (0.001").

Substrate thinning may be performed by mechanical or chemical means. In a mechanical thinning process, the substrate surface to be thinned is brought into contact with a hard and flat rotating horizontal platter that contains a liquid slurry. The slurry may contain abrasive media with chemical etchants such as ammonia, fluoride, or the combinations thereof. The abrasive operates as a "gross" substrate removal means, i.e. thinning, while the etchant chemistry facilitates "polishing" at the submicron level.

Thinning may also be performed by chemical etching. Unlike mechanical processing, substrates enter a tank containing a chemical etchant. Substrates are thinned by the action of a vigorous chemical reaction with the substrate composition. For example, silicon may be etched at rapid rates using a mixture of nitric acid with levels of fluoride present, or by the use of a strong alkali such as potassium hydroxide. Chemical etch rates are typically more difficult to control due to their high rates of removal, which may approach 100 um per minute. Where bath control is needed to achieve greater uniformity, a diluted chemistry with temperature controls is common practice.

In both cases of mechanical and chemical thinning, the substrate is maintained in contact with the media until an amount of material has been removed to achieve a targeted thickness. While it is of interest to achieve substrate thinning, it is simultaneously an objective to protect the device areas during such processing. Temporary mounted carriers may include sapphire, quartz, certain glasses, and silicon. They and usually exhibit a thickness of 1000 um (1 mm or 0.040"). Substrate choice will depend on how closely matched the coefficient of thermal expansion (CLTE) is between each material. Although it is common to use transparent carriers such as sapphire, quartz, and glass, some cost sensitive processes may use silicon with an alternative practice to the use of visible light microscopy for locating alignment markers or conducting inspection. Where necessary, carrier substrates may be produced with holes, channels (e.g. grooves), or other similar designs. These specially designed carriers offer an enhanced transport of chemical fluids to the surface of the substrate in order to accelerate demount.

All external carriers require the use of an adhesive for mounting onto the device substrate. The adhesive becomes incorporated into the substrate-carrier package (substrate package), whereby its properties must exhibit thermal resistance to be accepted into the steps of thinning and backside processing. The adhesive must maintain a rigid network such that no mechanical compromise occurs (e.g. movement) and any reference points established during mounting will be preserved. The maximum temperature exhibited in wafer backside processing occurs during resist baking, via etching, and deposition of certain metals or oxides. In U.S. Pat. No. 7,098,152 (2006), Moore, a process of using an external temporary carrier is described with an adhesive coating that withstands processing temperatures up to and including 130 degrees centigrade.

Another desire of the adhesive is to exhibit good chemical resistance. This must be established for a range of chemistries from strong etchants used in post-thinning stress relief such as sulfuric, ammonia, and/or peroxide, as well as organic solvents used in the lithography and clean steps during via-hole processing. Ideally, the adhesive must be resistant to these process chemistries, yet be selectively dissolved and removed at the end of the manufacturing process line. At times, certain aggressive chemistries may be chosen which have detrimental effects on the adhesive. As such, some temporary manufacturing measures may be taken to include protective tape or other coverings.

Mounting adhesives used to apply external temporary carriers to silicon and compound semiconductor wafers are disclosed in U.S. Pat. No. 6,869,894 (2005), Moore, and in Mould, D., and Moore, J., *A New Alternative for Temporary Wafer Mounting*, GaAs ManTech Conf. and Proc., pp. 109-112, (2002). The compositions and practices identified in these references provide the necessary conditions as an adhesive coating that is thermally resistant up to and including 130 degrees centigrade. In U.S. Pat. No. 7,232,770 (2007), Moore et al., and the publication by Moore, J., Smith, A., and Kulkarni, S., *High Temperature Resistant Adhesive for Wafer Thinning and Backside Processing*, GaAs ManTech Conf. and Proc., pp. 175-182, (2004), describes a similar process of using an external temporary carrier with a high temperature resistant adhesive which may be processed at temperatures exceeding 200 degrees centigrade. At the time of this application, other adhesive compositions have been disclosed in U.S. Patent Application No. 2007/0185310 A1 (2007), Moore et al., where thermal and chemical resistant coatings are taught for adhering external temporary carriers that withstand processing temperatures that exceed 200 degrees centigrade and are resistant to polar solvents commonly used in semiconductor fabrication areas, such as n-methyl pyrollidone (NMP).

The polymer compositions as described in U.S. Pat. No. 6,869,894 (2005), Moore, U.S. Pat. No. 7,232,770 (2007), Moore et al., and U.S. Patent Application No. 2007/0185310 A1 (2007), Moore et al., involve the following chemistries: a thermoplastic rosin-urethane, a thermoset silicone, and a thermoplastic rubber, respectively. With the exception of U.S. Pat. No. 7,232,770 (2007), Moore et al., both U.S. Pat. No. 6,869,894 (2005), Moore and U.S. Patent Application No. 2007/0185310 A1 (2007), Moore et al., involve the casting of polymers from a chemical mixture and curing by evaporation. All of the above noted disclosures require the use of organic solvents during demounting of the external temporary carrier by dissolving and removing the adhesive polymer.

According to the disclosures in the U.S. Pat. Nos. 6,869,894, 7,232,770, and U.S. Patent Application No. 2007/0185310, they all describe different adhesive chemistries. These items are used for traditional methods of attaching an external carrier support made of glass, sapphire, or silicon. The attachment process requires a special tool to coat the substrate, cure, align the substrate and carrier, and mount by using heat or another similar activation step. When demounting, the process is usually reversed, however, an organic chemical is used to penetrate the adhesive, swell the polymer, and facilitate full dissolution such that complete carrier demount from the substrate is achieved.

Mounting and demounting of the external carrier can be a lengthy and a delicate process. During mounting, the device substrate is coated with an adhesive and cured to a level sufficient to secure both surfaces. Attention must be given to the adhesive's ability to planarize the device surface, such that the topography is fully encapsulated and protected during the carrier mounting when excessive pressures may be applied. A special tool is used to bring the surfaces of the adhesive coated device wafer and carrier support into contact with each other. Depending upon the adhesive, the mounting process will utilize heat, light exposure, and pressure to achieve cure and facilitate a securely mounted substrate and carrier. Demount is the reverse process, involving the separation of the external carrier from the device substrate by a means of chemical, mechanical, or processes that involve the combination thereof.

Chemical demounting requires the use of perforated support substrates, specially fabricated to increase the rate of chemical penetration leading to dissolution and removal of the mounting adhesive. In this process, the chemistry of choice is an organic solvent that is heated and allowed to diffuse into the holes (perforations) or channels (grooves), as well as the bond line between the external carrier and device substrate. Organic solvents are generally used to demount the external carrier and remove residual polymer adhesive on the device substrate surface. These chemicals are needed in excessive quantities (e.g. 20-40 gallons) in a cleaning process, whereby the substrates travel from one heated bath to another in an effort to demount the external carrier and remove the adhesive to deminimus levels on the device substrate and result in a clean surface. The entire demount process is lengthy, commonly measured in hours.

Alternatively, thermo mechanical demounting may be achieved with thermoplastic adhesives. As taught in U.S. Pat. No. 6,792,991 B2, Thallner, and U.S. Patent Application No. 2007/0155129 (2007), Thallner, separation may be achieved by heating the mounted external carrier and device substrate to a temperature above the melting point of the thermoplastic adhesive while simultaneously applying a shear force in a manner designed to separate the mounted surfaces. In other words, the device substrate is removed from the external support carrier by heat and a mechanical force of a predetermined amount and in an orientation sufficient to demount the two surfaces. Cleaning with a selected organic solvent typically follows to ensure residual adhesive is cleaned from the substrate.

When mechanical separation is conducted, substrate removal is typically faster than diffusion-limited chemical demount processes. However, specially designed tools must be used to remove a thinned device substrate from the external carrier without damage to the topography. These tools drive up the overall costs of the process. Although mechanical removal may proceed faster than chemical, a true comparison should consider total substrate throughput. In this case, a chemical process is typically done by a batch process where two or more cassettes of twenty-five (25) wafers are accommodated in a bath as compared to a mechanical tool that operates as a single wafer handling operation. Further, there is an increased risk in substrate damage when using a mechanical device that moves or pulls the microelectronic substrate against the surface of the external support carrier. Where there may be an interest to consider mechanical equipment, such adoption would be difficult to meet the requirements and cost constraints of handling irregular and large substrates such as microelectronic panels.

Another application for substrate thinning, which also requires the use of external carrier supports, is described in the U.S. Patent Applications 2009/0017248 A1 (2009), Larson et al., 2009/0017323 A1 (2009), Webb et al., and in the International Application WO 2008/008931 A1 (2008), Webb et al. These applications describe the use of a layered body that is formed which comprises the substrate being attached to a rigid support (carrier), described here as an external carrier support. The adhesive described is a bilayer system composed of a photothermal conversion layer and a curable acrylate. A preliminary review of the bilayer system appears to emphasize its chemical complexity, however, it follows with claims of improvements during the demount part of the process. The applications cite the use of a laser irradiation device which allows rapid demount of the external support carrier and is followed by a mechanical peeling practice of the curable acrylate from the thinned substrate. Although these improvements may be recognized for demounting the external carrier, concerns exist about the throughput of this design for high-volume substrate manufacturer and its cost effective application to large panels.

When discussing display manufacturing or any panel-making endeavor, there is a more serious need for readily demountable processes. The substrates are much larger than semiconductor wafers and as such, the bonding and debonding mechanisms require more time, or in some cases, are unsuccessful. Throughputs for displays are typically required to be higher than semiconductor wafers, due to the fact that each wafer represents hundreds or thousands of devices, where one panel may represent very few component displays. Several demount mechanisms exist, however they surround either laser ablative or plasma texturing of the substrate surface with a specific adhesive. In U.S. Pat. Nos. 7,045,438B2, 7,147,740B2, 7,180,093B2, 7,332,381B2, 7,351,300B2, 6,946,361B2, Takayama, et. al, discuss bonding layers which are deposited onto the substrate by vacuum deposition with internal stresses present, whereby the corresponding layers have contradictory compressive and tensile stress and debonding is triggered by laser interaction. In U.S. Pat. No. 6,036,809, Kelly, et. al, U.S. Pat. No. 7,867, 876B2, and U.S. Pat. No. 7,932,614B2, Codding, et. al, and U.S. Patent Application No. 2009/0218560, Flaim, et. al, there is mention of the use of laser ablation for debonding thin and delicate substrates as used in the semiconductor market.

Laser ablative tooling is non-trivial, in that it requires exacting focus of an optical device of a specific wavelength and to do this onto an interface between the work unit and the carrier substrate. The laser's focus does this while it or the substrate is being shifted in continual motion moving rapidly across the substrate. As well known to those familiar with the art of coatings and planarization efforts, there will be irregularities in materials applied over the surface of the work unit. The adhesives used for these practices vary between rubber, silicone, polyimide, acrylic, and the like. The laser transmits through an optically clear carrier substrate and focuses onto the interfacial region where the adhesive meets the carrier, causing a significant and immediate rise in temperature, or burning of the material to destroy the adhesion. There is a micro area of impact that absorbs this temperature rise and fall for that second. The laser continues to move to the next location in an apparent smooth fashion until the entire surface of the substrate has been exposed and thereupon the release of the work unit is expected. The impacts of this process is realized later with irregularities commonly observed such as micro-cracks, fissures, and residue that is burnt onto surfaces which cannot be removed. Laser ablative processes, although a common practice for debonding delicate substrates, remains a subject of much discussion when considered for high volume manufacturing.

The practices mentioned here to support delicate devices for microelectronic processes as well as many others that are faced daily, present serious and compelling challenges. Further, there is a continuing need for improved "green" processing of device substrates in microelectronic manufacturing. A green process and their associated chemistries reduce or eliminate hazardous substances. According to the *American Chemical Society's Green Chemistry Institute*, there are twelve (12) principles, which help to define a green chemistry. Replacing the organic solvents to demount a device substrate and remove residual adhesive fits with this plan. Where processes require the use of chemicals to conduct cleaning, a desire exists to use aqueous-based systems and to rinse with DI water.

There is a challenge to design a process that is supported by a tool that will enable rapid processing of parts, and complete adhesive removal with an aqueous material without deleterious effects to the substrate. An adhesive that breaks down, dissolves, and allows the release of the work unit without single wafer handling equipment is a significant benefit to throughput and ease of manufacturing. This invention describes a detergent soluble adhesive that uses simple and cost effective process equipment generally accepted for aqueous processing. There is a continuing emphasis for the microelectronics industry to be green through improving the safety of operations, reducing the use of chemistry, and reducing the generation of hazardous waste. Taking these challenges together, there is a pressing need to provide a consistent and universal process, which uses an adhesive composition with a temporary rigid carrier, provides high performance, high throughput, a green process, and all at a reduced cost of ownership.

SUMMARY OF THE INVENTION

In accordance with this invention, a chemical composition and the manner that it is used is provided to temporarily bond an inorganic substrate and provide support for post processing, including thinning, backside applications, and other steps that require resistance to mechanical, thermal, and chemical exposure. Once the process is complete, it is an object of the chemistry of this invention to be dissolved by chemical intervention and to allow the work unit to be released and cleaned in a simple fashion. For this purpose, the invention chemistry is termed a temporary adhesive.

It is another object of this invention to provide a fundamental change in composition of matter that is currently in practice within the manufacturing industries for electronic devices. This invention provides a novel chemistry in the adhesive design such that it is dissolved and completely removed by the use of simple aqueous based detergents. These materials are in contrast with organic solvents by providing safe materials for workers, lower cost and complexity for permitting, improved compatibility with tools (i.e. no explosion-proof devices), and reduction in waste generation. Further, the use of aqueous systems are well known to companies who fabricate devices as deionized water (DIW) is a predominant material used throughout the industry.

It is another object of this invention to provide an adhesive chemistry, whereby its dissolution may be used in batch processing tools. Aqueous detergents of the variety where a powder or liquid concentrate is used and diluted into DIW are readily accepted in the industry and is compatible with tooling. Aqueous systems can operate more aggressively than those that use solvents, as there are no flash point concerns, serious explosion worries, or potential spark generation from multiple moving parts in an apparatus that needs to increase agitation. In fact, this invention is considered as a direct or drop-in replacement for organic solvents with no new tool or special equipment required and the associated rinsing and drying steps are considered the same. More important, the removal of adhesives by aqueous cleaning proceeds faster than solvent processing, and as such, is a strong consideration for processing by batch means as compared to single wafer handling. Batch processing using cassettes allows high throughput, sometimes increasing by a factor of 10× or more. For example, at the time of this document preparation, common single wafer throughput values for de-bonding is between 8-12 wafers per hour (wph). For a batch processing tool using wafer loading between 12-25 per cassette and cleans within 15 min, it is possible to experience between 50-100 wph. This number can rise significantly as fixture designs may accommodate multiple cassettes.

It is a further object of the invention to provide a lower cost means for temporary affixing and releasing substrates for electronics processing. Due to the aqueous detergent soluble aspect of our invention, there is a recognized lower cost of the tooling and of the cleaning. Aqueous processing tools may reduce the cost for solvent systems by as much as 50%, due to using conventional processing equipment without explosion proof or enclosed systems. Equipment permitting cost is lower or even eliminated as compared to solvent systems. The material cost for aqueous cleaners are inherently lower, projected to be less than 50% of solvents, due to the dilution in readily available DIW. A reduced cost near 25% of shipping and storage, is expected due to a lower regulatory/permitting requirement and less material shipped due to onsite dilution. Finally, the waste generated may be simply neutralized, filtered, and disposed to a local municipal plant, virtually eliminating the waste stream for organic solvents.

These objects, and other objects which will become apparent from the description which follows, are achieved by an aqueous detergent soluble coating produced by a mixture which comprises a Lewis acid, defined as a substance which can accept a pair of electrons. The invention is further defined to comprise mixtures of the Lewis acid with one or more from the group epoxy, acrylate, silicone, urethane, rubber, and engineering polymer. The invention further defines its mixtures to include rheological modifiers such that upon their addition, the viscosity is increased to a level sufficient to be applied to surfaces with significant features or textures to produce a cured coating that planarizes said surface to a level such that subsequent manufacturing steps may proceed.

The invention contemplates the provision of coating onto inorganic substrates in a manner that encapsulates and protects the present fragile features to an extent that allows the temporary bonding of that surface to occur with a carrier substrate. The coating is sufficiently hard and of a strength necessary to resist high speed grinding, polishing, or other aggressive shear intensity forces imposed during semiconductor wafer operations. The invention expresses resistance to high thermal temperatures and chemistries that are imposed during common microelectronic processes. This invention conducts this provision within the processing parameters of a conventional tool used to coat substrates in a manner suitable for the manufacture of semiconductor wafers and display substrates to include spin, spray, slit, draw, brush, and other related practices known by those familiar with the art. Once the imposed manufacturing process is completed, the coating is able to be easily and rapidly removed in aqueous alkali detergent (e.g. water) by dissolution, lift-off, or related mechanisms deemed acceptable to normal fabrication practices in this area.

While the present invention provides compositions and methods to produce aqueous detergent soluble coatings and adhesives, they are particularly adapted for temporary coatings and adhesives used for temporary bonding and debonding of work units upon carrier substrates in processes requiring the handling of thin substrates in electronics manufacturing. The invention identifies substances that are employed to coat and protect delicate features present on thin substrates, for example, semiconductor wafers. Further, the invention is useful in manufacturing displays by allowing the handling of irregular work units affixed to carriers. Electronic work units that contain complicated and fragile electronic circuits that include various layers and structures such as metal, semiconductor, and the associated organic materials. Typical work unit compositions may include, for example, glass and ceramic, quartz, and thin organic materials as polyimide, polyester, and others deemed successful for the manufacture of displays.

DESCRIPTION OF THE PREFERRED EMBODIMENTS

Figure 1:
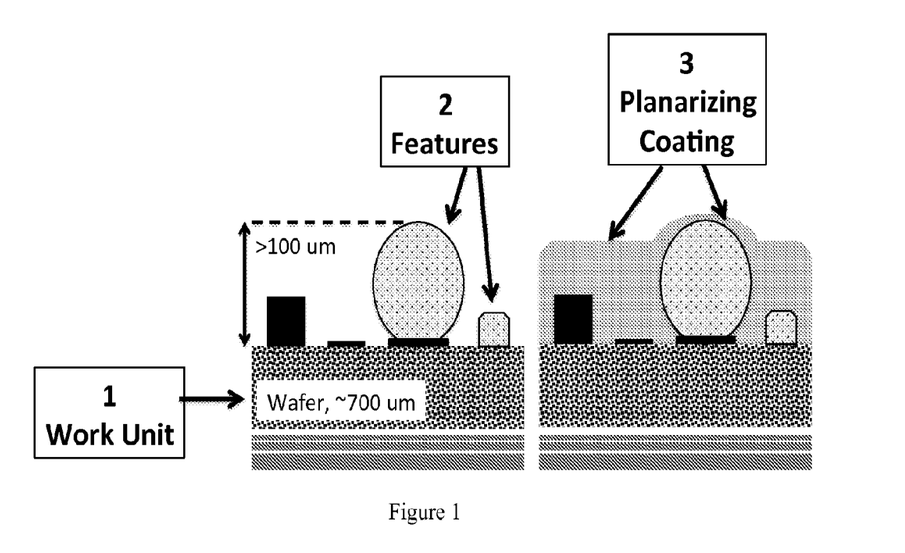
FIG. 1. portrays a description of the coating model, where work unit 1 exists with features 2 which are >100 um above the surface of the work unit and said planarizing coating 3 and following a manufacturing process, may be easily and simply removed using aqueous detergents.
Figure 2:
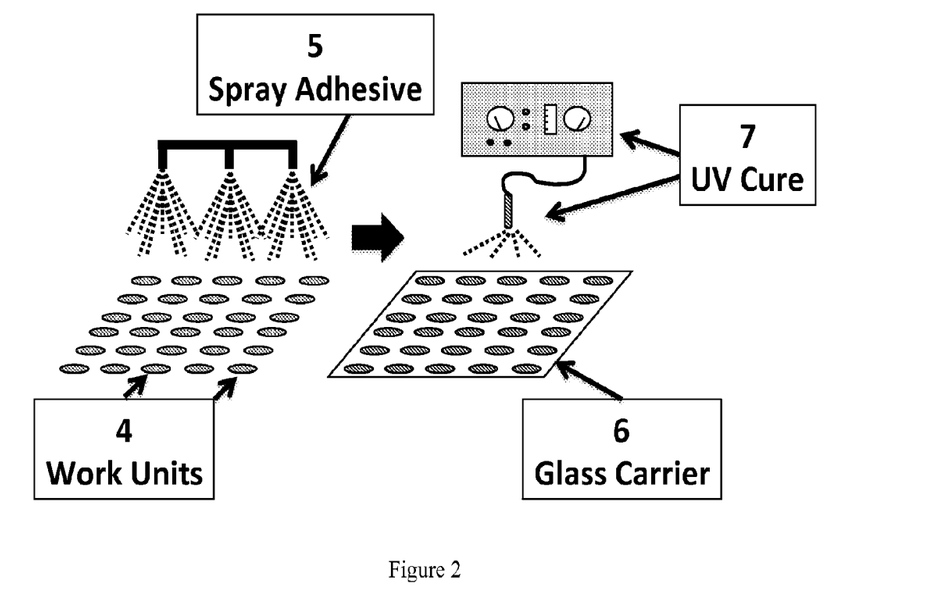
FIG. 2. portrays a description of the adhesive model, where work units 4 have spray adhesive 5 applied to them and subsequently are affixed to a glass carrier 6 by UV cure 7 practices, and following a manufacturing process, the adhesive may be easily and simply removed using aqueous detergents.

In the case of temporary protection of electronic work units with topography containing features >100 um and the temporary affixing of thin work units to carriers, a need exists for a coating to planarize such features and an adhesive to bond such units. For high volume manufacturing, the coating and adhesive is applied in a manner to achieve rapid curing and affixing, provide resistance to mechanical, thermal, and chemical effects during manufacturing, and to easily remove in aqueous detergent. The models of a coating (e.g. planarizing) and adhesive are given in FIGS. 1 & 2, where the coating is applied onto a work unit (e.g. semiconductor wafer) and the adhesive to work units in the display market (e.g. glass to for affixing to carrier substrates) such that these respective coatings and adhesives are cured, protects, and supports the work unit until it is later cleaned and released by direct exposure to aqueous detergents. FIG. 1. portrays a description of the coating model, where work unit 1 exists with features 2 which are >100 um above the surface of the work unit and said planarizing coating 3 and following a manufacturing process, may be easily and simply removed using aqueous detergents. FIG. 2. portrays a description of the adhesive model, where work units 4 have spray adhesive 5 applied to them and subsequently are affixed to a glass carrier 6 by UV cure 7 practices, and following a manufacturing process, the adhesive may be easily and simply removed using aqueous detergents.

A composition with tunable acidity using a Lewis acid is applied to a work unit as a coating or adhesive is sufficient to support a manufacturing process, and upon completion, the composition is removed by exposure to aqueous detergent. An ideal acidity is tuned to be sufficient to hydrolyze and saponify by aqueous detergents.

The Lewis of the invention is desired to be dissociative in water sufficient to achieve a minimum strength such that when alkali materials come into direct contact during aqueous detergent cleaning, the material will begin to breakdown, saponify, and hydrolyze to produce complete dissolution where it is then easily rinsed away. Lewis acids comprise regular known acidic compounds, Bronsted-Lowry acids, and virtually all compounds with can accept a pair of electrons. The preferred characteristic to express Lewis acid strength is through the respective dissociation constant of the species. Preferred values of the acid dissociative constant, $K_a$, is for $K_a \geq 1 \times 10^{-6}$ ($pK_a \leq 6$), more preferred, $K_a \geq 1 \times 10^{-5}$ ($pK_a \leq 5$), and most preferred, $K_a \geq 1 \times 10^{-4}$ ($pK_a \leq 4$). The Lewis acid species may exist singularly or in a mixture that comprises several molecular forms. These forms may include common acidic materials as alkyl-sulfonic acids such as methanesulfonic (MSA), Toluenesulfonic (TSA), and dodecylbenzene sulfonic acid (DDBSA), formic acid, fatty acids, sulfuric acid, nitric acid, or phosphoric acids, weak organic acids as fatty acids such as citric and ascorbic acid, terpene acids, phthalic and terepthalic, and compounds identified with a carboxylic acid group (COOH); Lewis acids also include non-recognizable acidic materials, such as boron trifluoride ($BF_3$).

This invention describes a mixture that includes a tunable acidity, whereby the system is brought into direct contact with a solid work unit and cured in a variety of ways to produce a final condition. During the application and use of the chemistry, it may be cured by evaporation, initiation, or reacted to effect the desired work function for the manufacturing process. When applying to a surface for protection or adhesion, the result will be dependent upon several factors, including the substrate composition, condition of the substrate surface, texture and/or porosity of the surface, and history of thermal exposure of the coating and/or the work unit. Additionally, the value of adhesion force by peel testing is dependent upon the method includes the peel angle (i.e. 90 or 180 degrees), width of the peel area, and the speed of peeling the specimen. Given these variable conditions are well understood by those familiar with the art, they can been controlled and maintained uniform such that adhesive force may be studied by adjusting the chemistry of the adhesive.

The effect of aqueous detergents upon the coating or adhesive is dependent upon the corresponding changes in the coating chemistry, the Lewis acid chosen, and the amount by weight in the system. Using this understanding, there can be tuning in the Lewis acid in a manner that will govern the measured detergent cleaning speed and effectiveness. In other words, through the selection and adjustment of Lewis acid, the cleaning speed and effectiveness of releasing the work unit may achieve a specific value sufficient to support a manufacturing process yet allow the rapid removal of the work unit without harm or change to its form.

A variety work units may be used with this invention to include inorganic and organic films. Inorganic work units may include films and foils of metals and ceramics. Metal films and foils may be used to include copper (Cu), nickel (Ni), iron (Fe), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridium (Ir), rhodium (Rh), ruthenium (Ru), nitrides thereof, such as titanium nitride (TiN), and alloys thereof, such as nickel iron (NiFe). Work units may exist initially as foils or may be vacuum deposited onto a temporary coating or adhesive such that the work unit of the metal is completed to a level that its integrity is of a minimum requirement sufficient to proceed with manufacturing and may be removed later by exposure to aqueous detergents. The minimum time to clean and release the work unit may be defined by several properties, to include the amount of Lewis acid present in the composition.

Work units may exist as crystalline and amorphous ceramic materials include silicon, gallium arsenide, quartz, glass, and alloying mixtures thereof. These ceramic and glass materials may exist initially as foils or films. Work units composed of ceramic and glass materials may be produced by vacuum deposition onto a temporary adhesive such that a work unit of the ceramic or glass is completed to a level such that its integrity meets a minimum requirement sufficient to proceed with manufacturing and may be removed later by aqueous detergency. The minimum time to clean and release the work unit may be defined by several properties, to include the amount of Lewis acid present in the composition.

Organic films which represent temporary adhered work units include polyimides such as Kapton® (registered trade mark of E.I. du Pont de Nemours and Company), polyarylether such as Arylite® (registered trade mark of Ferrania), polyesters such as Mylar® (registered trade mark of DuPont Teijin Films), polypropylene, polyethylene, polysulfone (polysulfone, polyethersulfone, polyphenylsulfone) such as Radel® (registered trade mark of Solvay Solexis), polybenzimidazole, polyphenylene sulfide such as Torelina® (registered trade mark of Toray Film Products, Co., Ltd.), polycarbonate, polystyrene, polyacrylic, fluoropolymers as fluoroethylene propylene (FEP), perfluoroalkoxy polymer (PFA), ethyltetrafluoroethylene (ETFE), and ethylene-chlorotrifluoroethylene (ECTE) such as Halar® (registered trade mark of Solvay Solexis), polyvinylidene fluoride (PVDF) such as Kynar® (registered trade mark of Solvay Solexis), polyether ether ketone (PEEK), polyether imide (PEI), polybutylene terephthalate (PBT), polyethylene naphthalate (PEN), and various polyamides classified as nylon. Work unit polymers may exist initially as films, may be cast from liquid solutions, or may be vacuum deposited directly onto a coating or temporary adhesive such that a work unit of the polymer is completed to a level such that its integrity reaches a minimum requirement sufficient to proceed with manufacturing and be removed later by aqueous detergents. The minimum time to clean and release the work unit polymer may be defined by several properties, to include the amount of Lewis acid present in the composition.

The tunable acidic coating and adhesive chemistry comprises polymeric resins from at least one specific chemical family and may also be combined with other separate chemical families. The adhesion force is controlled by the content adjustment of mixing resins of different molecular weights or functionality within a chemical family or by mixing between different chemical families. For example, one temporary adhesive may comprise one or more resins from the family of epoxy resins (i.e. alkyl epoxy, novolac epoxy, etc.) whereas, another temporary adhesive may comprise one or more resins from different chemical families (i.e. epoxy and acrylic, etc.). The variation of these resin choices will produce a direct effect on the adhesive force of the system in affixing the thin solid material onto the carrier substrate. Those familiar with the art recognize that in order to effect the reaction of such chemistries, there must also include the necessary initiators. These initiators are considered as cross-linkers, activators, catalysts, or reactors, and represent a small portion of the overall composition. Therefore, it shall be understood that whenever mention is made about the use of a specific chemistry or resin, that chemistry must include the respective initiator, and the choice of the initiator may produce certain subtle differences, the primary emphasis is that an initiator that is matched with the chemistry of choice must be included in the system.

The temporary coating and adhesive chemistry may comprise a variety of base resins. The reactive resins include, but are not limited to, those undergoing cross-linking polymerization mechanisms, including epoxies, acrylates and silicones. These systems undergo thermal, chemical, and photo-initiated polymerization by condensation and addition mechanisms as described in the literature, and described as thermosets. Thermoset chemistries offer rigidity and resistance to the process conditions. Non cross-linking resins include those described as amorphous or thermoplastics. The thermoplastic resins may add strength and durability to the adhesive. Additional properties by amorphous polymers include barrier (gas non-diffusion), temperature resistance, transparency, detergency, and water solubility. The following passages offer more detail on the resins used in the adhesive chemistry. The production of a temporary coating and adhesive for use in this invention is not limited to the resins identified here.

Epoxy resins used for this invention may comprise a single or multiple epoxide functional group, also called oxirane, or ethoxyline, normally identified as a three-membered oxide ring described by the following structures classified as (1) glycidyl ethers, (2) glycidyl esters, (3) gylcidyl amines, (4) linear aliphatics, and (5) cycloaliphatics:

(1)

where both R, $R^1$, and $R^2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n)}$, —$C_nH_{(2n+1)}$, or —$C_nH_{(2n)}OH$ where n varies from 2-20; cyclic and aromatic hydrocarbon functional groups of the formula —$C_6X_5$, where X may be substituent groups such as hydrogen (—H), the halogens (—F, —Br, —Cl, —I), hydroxyl (—OH), and —COOH groups, $R^3$ represents a cyclic or aromatic structure of the formula —$C_6X_5$, where X may be substituent groups such as hydrogen (—H), the halogens (—F, —Br, —Cl, —I), hydroxyl (—OH), and —COOH groups, all of these variations may exist in multiple substituent formats, or monomers, as given in the example structure (6):

wherein structure (6) describes a polymer comprising monomers of glycidyl ether with substituent R and linked by $R^1$. Such resins may include: CARDOLITE 514 (difunctional glycidyl ether epoxy resin) produced by Cardolite Corporation, ADEKA EP 4088S (epoxy resin and urethane resin curing agent) produced by Adeka Corporation, EBECRYL3605 (partially acrylated bisphenol-A epoxy) produced by Cytec Industries, Inc.

In one embodiment, the epoxy resin includes that of structure (6), wherein the monomeric epoxide substituent is of the novolac variety, also referred to as epoxidized novolac resin, where R represents an aromatic ring of the form $C_6X_5$, where X may be substituent groups such as hydrogen (—H), the halogens (—F, —Br, —Cl, —I), hydroxyl (—OH), and —COOH groups, and the linkage $R^1$ is best represented by substituents of the formula —$C_nH_{(2n)}$. Such epoxy novolac resins include 3-6 epoxide groups per molecule (n=1.6) of the general formula exhibited by the structure (6). General commercialized products which meet this criteria include: DEN 431 and DEN 439 produced by The DOW Chemical Company; EPON 154, EPON 160 and EPON 161 produced by Resolution Performance Products (Hexion), REZICURE 3056 produced by SI Group.

Acrylic monomers and polymers used in this invention include acrylate esters by the general formula described in item (7), where both $R_1$ and $R_2$ may represent the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20; aromatic hydrocarbon functional groups of the formula —$C_6X_5$, where X may be substituent groups such as hydrogen (—H), the halogens (—F, —Br, —Cl, —I), hydroxyl (—OH), —COOH; and —$COOR_3$ groups, wherein $R_3$ represents the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20.

It is to be understood that where substituent groups are present, they should be present in a manner such that they do not unduly hinder or interfere with the thermal or photo initiated cure of the acrylic monomer. The preferred acrylic monomers are those represented by item (7), wherein $R_1$ is a hydrogen (—H), or methyl (—$CH_3$), defining the molecule as an acrylate or methacrylate, respectively, and $R_2$ to represent a substituent of the form or —$C_nH_{(2n)}OH$ where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1). The more preferred acrylic monomers are those represented by item (7), wherein $R_1$ is a hydrogen (—H), or methyl (—$CH_3$), and $R_2$ to represent a substituent of the form amide (—$NH_2$), defining the molecule as an acrylamide. Such preferred acrylics include n,n-dimethylacrylamide (DMAA, CAS #2680-03-7). DMAA has been shown to exhibit high compatibility and solubility for other resins and a significantly faster curing time over the conventional acrylates or methacrylates.

Polysiloxane resins suitable for use herein exist in commerce by multiple suppliers, exhibiting broad classification differences in silicone subcategories, types, and polarities, and reacting through different mechanisms, including addition and condensation polymerization. The use of such materials in the preparation of the adhesive shall consider compatibility and reactivity between the polysiloxanes as a key factor in determining their final behavior. For example, species of similar polarity may be compatible yet be inconsistent in their preferred reaction mechanisms. These include organofunctional polysiloxanes and silicone resin intermediates, both are expected to undergo thermal initiated condensation reactions following hydrolysis. However, vinyl silicones (rubbers) are largely a phobic chemistry and undergo addition reactions with metal catalysts. Therefore, we will differentiate these chemistries accordingly, as their use in an adhesive is expected to follow the same considerations of compatibility and reactivity.

The preferred polysiloxanes include oxysilanes of the formulas represented as $(R_1)$—$[(R_2)(R_3)SiO]_n$—$R_4$ or $(R_5)$O—$[(R_3)_2SiO]_m$—$R_5$, where $R_1$, $R_2$, and $R_3$, may exist as a hydrogen or carbon containing functional group of the variety as alkyl, phenyl, cycloalkyl, alkoxy, hydroxyalkyl, alkoxyalkyl, and hydroxyalkyalkoxy, where these groups may contain up to 6 carbons, and $R_4$ comprises hydrogen, alkyl, or phenyl, where a minimum of 2 of the groups are oxy substituents used for polymerization, and $R_5$ is similar to $R_4$, however, there may exist up to 12 carbons, and n and m varies from 1-5 or to a sufficient number to reach a molecular weight of 500,000.

Siloxane resins suitable for use herein include a broad range of alkyl, aryl, oxygenated, and cyclic substitutions. In the case where thermal resistance is critical, the substitution will be methyl and phenyl. The moieties on the siloxane can also exhibit specific organic functional groups that are well known to interact with the chemistry of the substrate interface. For example, in the case of a mercaptan siloxane moiety, the sulfur group interacts with certain inorganic solid surfaces, such as metals, to increase the interfacial adhesion force. Most importantly, moieties which exhibit epoxy, acrylic, or amine character, are known to interact with a corresponding chemistry within an organic matrix and at the interface of polymeric solid surfaces, resulting in molecular entanglement and van der Waals interactions as hydrogen and covalent bonding, and ultimately, an increase of adhesion.

Silicone resins based on cyclic siloxane molecules are preferred. Useful cyclic silicones are hydroxy functional cyclic silicones classified as liquid resins, flake resins, and silicone intermediates as provided by suppliers Dow Corning (www.dowcorning.com) and Wacker Silicones (Wacker-Chemie GmbH) (www.wacker.com). Preferred cyclic siloxane choices for adhesive development, include those with high compatibility with other polymers, dissolution in a wide range of solvents, and those classified as silanols. These silanol compounds exhibit relatively high capacity for condensation reactivity and include those with two or more hydroxyl groups per cyclic silicone molecular unit and a phenyl/methyl ratio ranging from 50-120% and a molecular weight ranging from 4,000 to 300,000. In all cases, the relative content of silicon dioxide is high, usually greater than 50%.

The choice of initiator is dependent upon the polymer and the application. Epoxy based systems use organic amine and acid materials to open the oxirane ring and initiate cross-linking. These may be promoted by thermal or photo means. Free-radical initiators are used with acrylics, also promoted by applications that apply heat or ultraviolet exposure. Silicone vinyl compounds require metal catalysts to initiate free-radical generation. These classes of initiators and the required media to support polymerization and enable applications of the adhesive to facilitate fixation of the two surfaces. In one embodiment, an epoxy resin system is used with an initiator that is of the polyamine form and of higher molecular weight. Higher molecular weight amine chemistries will remain in the system for longer durations and provide an environment, which efficiently cross-links the epoxy resin. Amines may include triethylenetetramine (TETA), N-methylethanolamine (NMEA), and N-methyldiethanolamine (DMEA) produced by The DOW Chemical Company, and meta-xylenediamine (MXDA) as produced by Mitsubishi Chemical Company. Desirable amine amounts are typically present at levels from about 1% to about 5%, by weight as compared that of the epoxy. A similar approach for epoxies may also be used with acidic materials. The acids tend to have higher reaction rates with epoxies over that of amines. Preferred acids are various sulfonic acids such as toluene, dodecylbenzene, and methane sulfonic acids. The epoxy begins to react upon contact, so the means of mixing and application must be considered. Where acidic reactions are preferred for epoxies are in the case of photo acid generators (PAGs). These systems comprise sulfonium salts that release varying molecular weights of toluene sulfonic acid to cause immediate reaction. This rapid reaction is used in many photoresists. One common photoacid generator is triphenylsulfonium trifluoromethane sulfonate (TPST). Typical amounts of a PAG is in the range of <2% by weight of epoxy.

Initiators for acrylic monomers include thermal (thermal radical initiator, TRI) or photo activated free radical initiators. It is well known from the literature that these free-radical initiated systems will combine with the vinyl group of the acrylic, initiate a chain reaction, whereby the product acrylate free radical combines with other vinyl groups of adjacent acrylics and produce final cross-linked product. These TRI materials include inorganic persulfates such as ammonium persulfate (APS), potassium persulfate, and sodium persulfate, and organic persulfates such as quaternary ammonium persulfates (e.g. tridodecyl ammonium persulfate); peroxides include benzoyl peroxide (BPO), methyl ethyl ketone peroxide, dicumyl peroxide, and benzopinacole (BK), cumene dihydrogen peroxide, and those organic peroxides under the tradename Luperox™ (Arkema, Inc., www.arkema-inc.com), azo-compounds including 2,2'-azobisisobutyrnitrile (AIBN), 4,4-azobis(4-cyanovaleric acid), 1,1'-azobis(cyclohexanecarbonitrile), acetates as peracetic acid, and tert-butyl peracetate. Benzoin photoinitiators are common for use as initiators for acrylic chemistry. One type of benzoin photosensitizer is 2-phenylacetophenone, which undergoes photoscission to release radicals of benzoyl, and benzyl, which become the primary chain polymerization initiators in the curing process. Photochemically generated free radicals react directly with the double bond of the vinyl monomer as a chain-initiating step. The invention involves a cure process between a photoinitiator that is present in the liquid polymer system and actinic radiation from an ultraviolet emission source. Common photoinitiators include benzoin ethers, acetophenones, benzoyl oximes, and acylphosphines. These initiators may include phenylglyoxylate, benzyldimethylketal, $\alpha$aminoketone, $\alpha$hydroxyketone, monoacyl phosphine (MAPO), bisacylphosphine (BAPO), metallocene, and iodonium salt. Preferred initiators include 2-hydroxy-2-methyl-1-phenyl-1-propanone (CAS #7473-98-5) and phosphine oxide phenylbis(2,4,6-trimethylbenzoyl)-(CAS #162881-26-7). A trade name product, which represents these materials, includes Irgacure 2022, as manufactured by CIBA Specialty Chemicals, Basel, Switzerland. The product exhibits absorption maxima at 365 nm, 285 nm, and 240 nm. Concentrations are used anywhere at ≤5% by weight.

Adhesive mixtures which are chosen to use silicone resins may contain anywhere from 20-100% solids of silicone polymers having polysiloxane-vinyl and silyl-hydride character. In the presence of a metal catalyst, the vinyl compounds initiate free radicals that undergo addition polymerization with the silyl-hydride to produce a polymerized final product. To control the reaction rate for application and bonding, there are chelates binding the platinum. During heat exposure, the chelate degrades to release platinum and then triggers polymerization. In the case of silanol polysiloxanes, these monomers will crosslink upon heat exposure, usually in the range 200-250 C.

Additives may also be present to facilitate adjusted adhesion. For example, the use of fluoropolymers are known for surface sensitive activity. The addition of fluoropolymer surfactants meet this objective. Other common surfactants as nonionics or charged species as cationic or anionic may provide surface sensitive adjustments in adhesion and also allowing fluctuations in melt point to give an amorphous character to improve adhesion.

In addition to the resins, initiators, and additives, the chemistry of the temporary adhesive may also contain fillers. These are specifically exemplified by fibrous fillers such as glass fiber, asbestos, alumina fiber, ceramic fiber composed of both alumina and silica, boron fiber, zirconia fiber, silicon carbide fiber, metal fibers, polyester fibers, aramid fiber, nylon fibers, phenolic fibers, natural plant and animal fibers; granular or particulate fillers such as fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, aluminum nitride, silicon carbide, magnesium oxide, beryllium oxide, kaolin, mica, zirconia, and so forth; and mixtures of two or more of the preceding.

There exist several mechanisms for curing, B-staging, reacting, and alike for coating and inserting and affixing the adhesive between a thin solid material and the carrier substrate. As a fundamental characteristic of any coating or adhesive, there must be sufficient wetting between both surfaces. Wetting is defined as the interaction of a lower contact angle (low energy) liquid or semi-solid onto a higher contact angle (higher energy) substrate. In many cases, the difference in surface energy between the adhesive and surface can be as low as 10 dynes/cm, however, the difference is preferably much larger. In optimum conditions, a lower energy adhesive will wet and spread over the higher energy surface of the substrate and achieve good wetting.

Although wetting is fundamental to successful coating, the resulting coating adhesive force is dependent upon the chemistry of the adhesive and the interaction of its chemical functionality with the substrate. This interaction is dependent upon the application, cure, and affixing steps. The coating and adhesive chemistry may comprise organic resins in pure form (i.e. 100% solids) or dissolved into carrier solvents. Cure programs may involve a soft bake step to affix the material to the carrier substrate, followed by a hard bake whereby the thin solid substrate is held in direct contract with the B-stage adhesive affixed to the carrier substrate. The mechanism by which the coating and adhesive is applied, cured, and the thin substrate is brought into contact with the adhesive includes a plurality of approaches which this invention is not limited. Choices on these approaches are based upon many considerations, including the handling of the thin solid material, cure mechanism, and that method which minimizes the existence of trapped air and completely fills any voids. Regardless of the approach, the final objective is to achieve a bonded form where the thin solid material is affixed to the carrier substrate, which now allows the manufacturing process to proceed.

Once the manufacturing process is complete, removal of the work unit is performed. The exact mechanism may vary between conventional batch type cleaning within a wet bench with detergent tanks. The rate of penetration and reaction with the coating and adhesive chemistry is dependent upon the level of Lewis acid and the respective dissociation constant for the acid in the invention chemistry. To reduce harm to the integrity of the work unit, the content and choice of Lewis acid is tuned for maximum performance. The preferred choice in Lewis acid is based upon the respective values of the acid dissociative constant, $K_a$, is for $K_a \geq 1 \times 10^{-6}$ ($pK_a \leq 6$), more preferred $K_a \geq 1 \times 10^{-5}$ ($pK_a \leq 5$), and most preferred, $K_a \geq 1 \times 10^{-4}$ ($pK_a \leq 4$).

Applications of handling and supporting thin work units are becoming a common challenge in the manufacturing of electronic devices. Due to the reduced cost structures continually promoted, the manufacture of virtually any electronic device is most competitive when it is conducted in Asia. Because cost pressures exist there must be options for a simple design in coating and handling thin work units in electronics. The scenarios vary for semiconductor and display. For example, semiconductor wafer substrates are round, extend to 12" in diameter, and are robot transferred from tool to cassette. Conversely, display panels are square or rectangular, can extend to more than 60" on a side, and are conveyorized. In consideration of work units for each market, substrate thickness may vary from as low as 10-100 um (microns). By offering the flexibility to tune or adjust the speed of detergent cleaning and release of the work unit when used with temporary coatings and adhesives, there is a broad range of options in adjusting acidity in the chemistry as it applies in manufacturing. These options reduce the need of new tooling and additional manufacturing steps. Through these practices and others not mentioned here, the invention's novelty and uniqueness is realized.

Prior art for affixing work units, such as silicon wafers, are described in U.S. Pat. No. 7,098,152 (2006) and U.S. Pat. No. 6,869,894 (2005), Moore, describe a rosin-urethane adhesive, whereby the wafer is removed by either chemical penetration through perforated carriers or by thermal slide by applying heat to above the melt point of the adhesive and using shear force onto the thin wafer. U.S. Pat. No. 7,232,770 (2007), Moore et al., describes a cross-linked silicone adhesive that is removed by the method of chemical penetration with a perforated carrier. Both chemical penetration and thermal slide techniques require delicate handling of thin solid materials during the removal process, and the use of large-scale volumes of cleaning chemistry, primarily organic solvents. The use of chemicals, such as organic solvents, in microelectronic manufacturing adds costs, human exposure to toxic substances, and environmental impact by the generation of hazardous waste. It is therefore desired for an adhesive system that does not require organic solvents when handling of work units during removal.

Other applications which describe the adhesive support of work units are described in U.S. Patent Applications 2009/0017248 A1 (2009), Larson et al., 2009/0017323 A1 (2009), Webb et al., and in the International Application WO 2008/008931 A1 (2008), Webb et al. These applications describe the use of a curable acrylate and a photothermal conversion layer that is degraded during removal by a laser irradiation device. Such a device interacts with the substrate by burning or destroying the adhesion interface between the work unit and carrier substrate. Such an interaction can produce by products and residue that are not removable (cleaned), especially when the laser system and adhered surfaces are dynamically changing. Although the use of a laser has been demonstrated as a means of removing a thin solid material, it is generally believed this option will not meet the objectives of high-volume manufacturing of large panels and be made available at a cost that the industry can bear. For these reasons and others which are known by those familiar with the art, removal options which offer simplicity, high volume manufacturing, and low cost, are needed for work units affixed to carrier substrates.

While there is a desire to identify coating and adhesive materials to support work units of various compositions, thicknesses, shapes, and sizes, there also, is a challenge to design a process that affixes the material work unit by a tool, and when finished with the process, will remove the item without deleterious effects to the substrate. The need for flexibility in the adhesive chemistry is great, whereby once the concept to affix and remove the work unit is identified, the need exists to tune the adhesive force such that it fits the interdependence between the properties of the thin solid material and the tooling in the manufacturing line. Since a continuing emphasis exists for the microelectronics industry to be green and improve safety, a desire exists for an adhesive to perform without subsequent surface cleaning of the removed thin solid material. Taking these challenges together, there is a pressing need to provide adhesives that offer tunable acidity in the chemistry of the coating and adhesive to effect removal by aqueous detergency for a broad range of manufacturing by coating or affixing and removing a thin solid material onto a rigid carrier, meeting high throughput, is a green process, and is available at a reduced cost of ownership.

EXAMPLES

The compositions of the invention and the method of making of the examples are described. It is understood, however, that the invention is not meant to be limited to the details described therein. In the examples, the percentages provided are percent (%) by weight unless otherwise stated. The invention is further illustrated, without limitation, by the following examples. The measurement of performance and selectivity of the invention is conducted using practices readily accepted by the industry.

Coatings are produced on a Brewer Science, Inc. CB-100 spin-coater, while spray and encapsulation uses custom tooling designed at Daetec. Metrology data is generated by a XP-1 stylus profiler, AFP-200 atomic force profiler, and a Xi-100 optical profiler (www.kla-tencor.com), using equipment settings 5 mg stylus load, minimum 4 mm distance, and a speed of 0.5 mm/sec. Modified thermogravimetric test methodology for outgas is conducted by typical laboratory scales (+/−0.1 mg). UV cure equipment includes the Intelli-Ray 400 microprocessor controlled light curing system (www.uvitron.com). Furnace support uses box type #ST-1200C-121216 with microprocessor programming, nitrogen purge, and dispersion fan for chamber uniformity (www.sentrotech.com). Force gage M5-series with 90 degree sled and stand ESM301, fixtures, and software (www.mark-10.com).

Silicon wafers and glass plates (~0.5 mm thick) are used as the inorganic substrate (carrier substrate) upon which the adhesive is applied, cured, and subsequent affixing of a thin solid material is tested. This material forms the basis for the survey, which the invention is demonstrated. Multiple polymers are tested and described for each example.

Example #1

This experiment demonstrates the use of various Lewis concept acids of the variety carboxylic acid (organic acid) as applied as coatings. Water solubility is tested and thermal resistance is indicated for each material. Most of the acids listed here exhibit dissociation values of $\geq 1\times 10^{-5}$ ($pK_a \leq 5$). The listing and results are in Table 1.

TABLE 1

Acidic products of the Lewis acid variety (carboxylic acids) and their results for water and detergency solubility. Materials are dissolved in solvents n,n-dimethylacetamide (DMAC).

| # | Coating (acidic) | Softening Point (C.) | Water solubility (observed) | Detergency (KOH based system) |
|---|---|---|---|---|
| 1 | 1,4-CHDA HP (CAS# 1076-92-7) | 165 | Limited/no | Yes |
| 2 | Sokalan DCS (CAS# 686603-87-2) | 120 | Limited/no | Yes |
| 3 | Isophthalic acid (CAS# 121-91-5) | 300 | Limited/no | Yes |
| 4 | Terephthalic acid (CAS# 100-21-0) | 300 | Limited/no | Partial |
| 5 | P-hydroxybenzoic acid (CAS# 99-96-7 | 213 | Limited/no | Yes |
| 6 | 4-Chlorobenzoic acid (CAS# 74-11-3) | 240 | Limited/no | Yes |
| 7 | Fumaric Acid (CAS# 110-17-9) | 300 | Limited/no | Partial |
| 8 | Phthalic Acid (CAS# 88-99-3) | 210 | Limited/no | Yes |

Example #2

Silicone resin intermediate Dow Corning Z-6018 (www.dowcorning) and siloxane Dynasylan 4148 (www.evonik.com) are mixed to determine detergency effect and effects to reduce outgas. Nanoparticle silica as Aerosil R90 (treated silica, Evonik) is used to further condensation of the silicone. Materials are mixed and applied to glass slides (2"× 3"), apply 0.25 g of a 25% solids solution. Materials are cured 130 C, 5 min, and 250 C 15 min. Thermal exposures are tested for outgas as material weight loss. Detergent is a standard KOH based system. The results for de-bond are listed in Table 2.

TABLE 2

Thermal resistance as outgas weight % loss and detergency for several mixtures of tunable acid coating and adhesive for aqueous detergency removal for a silicone resin/polysiloxane. Additives are reviewed for capability to reduce outgassing.

| # | Additive & amount | 250 C. 30 min | 350 C. 30 min | 350 C. + 30 min | Water Soluble | Detergency Soluble |
|---|---|---|---|---|---|---|
| 1 | Base -0- additive | 95.4 | 88.7 | 86.0 | No | Yes |
| 2 | Acid addition | 93.2 | 83.6 | 80.5 | No | Yes |
| 3 | Base addition | 94.7 | 85.4 | 82.1 | No | Yes |
| 4 | Nanosilica addition | 100.1 | 97.4 | 96.0 | No | Yes |
| 5 | Nanosilica addition | 100.5 | 97.9 | 96.3 | No | Yes |
| 6 | Nanoalumina add | 98.8 | 95.7 | 94.2 | No | No |

Example #3

This example tests various additives to an acrylic system that has a carboxylic acid present for detergent soluble coating and adhesive systems. The acrylic is n,n-dimethylacrylamide (Kowa American Company, www.chemical.kowa.com), to which 30% w/w of Joncryl HPD 671 (BASF Corp., www.basf.com), mixed and produce a clear, slightly yellow solution. To this several additives are inserted to the mixture, including: lithium styrene sulfonate (LiSS, TOSOH, www.tosoh.co.jp), polysiloxane methacrylic functional Dynasylan MEMO (Evonik, www.evonik.com), and epoxy as Epon 8021 (Resolution Performance Products, www.resins.com). In all cases, UV cure is conducted with 5% w/w of Irgacure 2022 added to each and exposed for 60 sec. Hard bake/temperature resistance is conducted to 300 C for up to 1 hr. Stress is measured on thin glass slides, 100 um thick, and measure height of bending slide. The additives are stated in Table 3 with concentrations and results.

TABLE 3

Results of systems as stated to given temperatures after UV cure

| # | Chemistry | Stress after UV | Stress @ 130 C. | 300 C. observe | 300 C. 1 hr | Deterg |
|---|-----------|-----------------|-----------------|----------------|-------------|--------|
| 1 | Base -0- add | 12 | 15 NC | Wet | Bubbles, cracks | Yes |
| 2 | 10% LiSS | 16 | 19 delam, crack | Soft | Bubbles, cracks | Yes |
| 3 | 5% LiSS | 5 | 5 delam, crack | Soft | Bubbles, cracks | Yes |
| 4 | 1% LiSS | 6 | 4 NC | Soft | No bubbles | Yes |
| 5 | 2% MEMO | 18 | 18 NC | Hard | Bubbles, cracks | Yes |
| 6 | 5% MEMO | Break | - - delam, crack | Hard | Bubbles, cracks | Yes |
| 7 | 10% MEMO | 10 | 10 delam, crack | Hard | Bubbles, cracks | No, flakes |
| 8 | 2% EPON | 5 | 9 delam, crack | Hard | No bubbles | Yes |
| 9 | 5% EPON | 17 | 17 NC | Hard | No bubbles | Yes |
| 10 | 10% EPON | 17 | 19 NC | Hard | No bubbles | No, flakes |

What is claimed is:

1. A temporary coating with tunable acidity and further containing a binder, wherein the coating and binder is applied to a work unit and subsequent to a manufacturing process, the acidity allows the removal with an aqueous detergent without harm and without the need for a subsequent cleaning process.

2. The temporary coating of claim 1 wherein the binder comprises an organic resin of one or more chemical families.

3. The temporary coating of claim 2 wherein the organic resin comprises one or more from the group epoxy, acrylate, silicone, urethane, rubber, and engineering polymer.

4. The temporary coating of claim 3 wherein the engineering polymer comprises one or more from the group polyimide, polyamide, polyamideimide, polybenzimidazole, polybenzoxazole, polysulfone, polyethersulfone, polyphenylsulfone, polyarylether, polyetheretherketone, polyvinylidenedifluoride, cyclic olefin copolymer, polyethylene terephthalate, polybutylene terephthalate, polyacrylonitrile, polyaryletherketone, polyketoneketone, styrene-acrylonitrile, polycarbonate, polystyrene, polyvinylchloride, polyphenylene sulfide, polytrimethylene terephthalate, polyvinylidene chloride, acrylonitrile butadiene styrene, and liquid crystal polymer.

5. The temporary coating of claim 3 wherein a mixture of the organic resin contains one or more polymer reaction initiators.

6. The temporary coating of claim 5 wherein the initiators comprise one or more from the group organic acid, photoacid generator, photobase generator, organic amine, thermal free radical, and photo free radical producing.

7. The temporary coating of claim 2 wherein a mixture of the resin contains a filler.

8. The temporary coating of claim 7 wherein the filler comprises one or more from the group nanoparticle, nanofiber, nanometal, fiber, glass bead, glass sphere, ceramic, and cellulose.

9. The temporary coating of claim 1 wherein the work unit comprises a film or foil.

10. The temporary coating of claim 1 wherein the work unit is produced from evaporation.

11. The temporary coating of claim 1 wherein the work unit is produced from plasma deposition.

12. The temporary coating of claim 1 wherein the work unit is produced from electrolytic deposition.

13. The temporary coating of claim 9 wherein the work unit comprises one or more from the group metal, ceramic, glass, organic polymer, and composite.

14. The temporary coating of claim 10 wherein the work unit comprises one or more from the group metal, ceramic, glass, organic polymer, and composite.

15. The temporary coating of claim 11 wherein the work unit comprises one or more from the group metal, ceramic, glass, organic polymer, and composite.

16. The temporary coating of claim 12 wherein the work unit comprises one or more from the group metal, ceramic, glass, organic polymer, and composite.

17. A temporary coating comprising a binder with tunable acidity, wherein the coating is applied to a work unit and subsequent to a manufacturing process, the acidity allows the removal with an aqueous detergent without harm and without the need for a subsequent cleaning process wherein the acidity is from the group Lewis acid.

18. The temporary coating of claim 17 wherein the Lewis acid comprises one or more compounds that exhibit a dissociation constant of >1×10-6 (pKa <6).

19. The temporary coating of claim 18 wherein the Lewis acid exhibits a dissociation constant of >1×10-5 (pKa <5).

20. The temporary coating of claim 19 wherein the Lewis acid exhibits a dissociation constant of >1×10-4 (pKa <4).

21. A manufacturing process where a temporary coating of claim 1 with tunable acidity is applied to a work unit and subsequent to a manufacturing process, the acidity allows the removal with an aqueous detergent without harm and without the need for a subsequent cleaning process, where the process is electronics.

22. The manufacturing process of claim 21 wherein the electronic process comprises semiconductor and display.

* * * * *